United States Patent
Ayers et al.

[19]

[11] Patent Number: 5,980,267
[45] Date of Patent: Nov. 9, 1999

[54] CONNECTOR SCHEME FOR A POWER POD POWER DELIVERY SYSTEM

[75] Inventors: David J. Ayers, Newark; Bill Samaras, San Jose; Dan R. McCutchan, Redwood City, all of Calif.

[73] Assignee: Intel Corporation, Santa Clara, Calif.

[21] Appl. No.: 09/005,563

[22] Filed: Jan. 12, 1998

Related U.S. Application Data

[63] Continuation-in-part of application No. 08/672,864, Jun. 28, 1996.

[51] Int. Cl.$^6$ ........................................................ H01R 9/09
[52] U.S. Cl. ................................................ 439/60; 439/620
[58] Field of Search ................................ 439/60, 67, 632, 439/493, 637, 620

[56] References Cited

U.S. PATENT DOCUMENTS

| | | | |
|---|---|---|---|
| 4,298,237 | 11/1981 | Griffith | 439/60 |
| 4,969,824 | 11/1990 | Casciotti | 439/67 |
| 5,196,994 | 3/1993 | Tanuma | 439/60 |
| 5,726,432 | 3/1998 | Reichardt | 439/493 |

OTHER PUBLICATIONS

International Search Report, PCT/US98/25567, 6 pages.

*Primary Examiner*—Neil Abrams
*Assistant Examiner*—Javaid Nasri
*Attorney, Agent, or Firm*—Blakely, Sokoloff, Taylor & Zafman LLP

[57] ABSTRACT

An improved connector scheme for a power pod power delivery system provides a low-resistance, low inductance path between a power source and a power consuming module. Specifically, the present invention is a connector scheme comprising a printed circuit board having a plurality of sets of planar pads, each of the plurality of sets of planar pads being coupled to a power source and/or a signal source, and a flexible connection for detachably coupling with each of the plurality of sets of planar pads on the printed circuit board.

3 Claims, 6 Drawing Sheets

CONNECTOR SCHEME FOR A POWER POD POWER DELIVERY SYSTEM

CROSS-REFERENCE TO RELATED APPLICATIONS

This is a continuation-in-part of application Ser. No. 08/672,864, filed Jun. 28,1996.

FIELD OF THE INVENTION

This invention relates to power delivery to electronic circuits in general and more particularly to an improved connector scheme for an improved power delivery system for supplying power from a power source to a power consuming module.

BACKGROUND OF THE INVENTION

Along with the development of higher levels of integration in integrated circuits, power requirements have increased. This is particularly true with current microprocessor and associated integrated circuits or chips recently developed and now being developed. These chips, which are operating at higher speeds, require and consume greater amounts of power than previously required.

In a typical computer system, a large printed circuit board known as a motherboard is provided. The motherboard contains a certain number of basic components and is supplied with voltage from a power supply, typically at a higher DC voltage (e.g., 12 volts) than required by the components on the motherboard. The motherboard includes connectors for daughter boards which can be plugged in to provide different capabilities for the computer. Such boards, for example, may provide an interface to disk drives and CD ROMs, modem interfaces for local area networks, etc. Typically, these daughter boards operate from the 12 volts which is supplied from the motherboard, or from reduced voltages such as 5 volts. Power consumption of the daughter boards is typically not extremely high (e.g. <20 W).

Current processors however have been designed to operate at lower voltages, e.g., 3.3 volts. Because of the increased capability and speed of these processors, they consume a large amount of power despite their lower voltage. Their operation at a lower voltage requires a localized dc-to-dc power converter to reduce the motherboard voltage. Typically, this dc-to-dc power converter is soldered to the mother board or plugs into a connector on the motherboard. The lower voltage is then conducted through conductors or printed circuit traces on the motherboard to a connector for the component requiring the lower voltage, e.g., a processor. This same connector may also provide signal connections.

In a number of state of the art systems, one or more processors, and in some cases associated integrated circuit devices, are mounted on a board or module. This module then plugs into a connector on the motherboard. Since the voltage required by the processor is lower, and the power consumption is high, the currents which must be supplied to the module become particularly large. As a result, it is difficult to establish a low resistance, low inductance path on the motherboard from the dc-to-dc converter board to the module. This is particularly true because the prior art arrangement requires that the high current pass through two connectors: one from the dc-to-dc converter into the motherboard and another connector from the motherboard through the module connector to the module. Also, the prior art arrangement may present difficulties in manufacture because the dc-to-dc converter becomes an additional component that must be tested with the remaining components on the motherboard.

Thus, there is the need for an improved arrangement for delivering power to a power consuming module requiring high amounts of power at a lower voltage, which voltage must be converted from a higher voltage.

SUMMARY OF THE INVENTION

The present invention discloses an improved connection scheme for a power pod power delivery system. Specifically, the present invention is a connector scheme comprising a printed circuit board having a plurality of sets of pads, each set of the plurality of sets of planar pads being coupled to a power source and/or a signal source, and a flexible connection for detachably coupling with each of the plurality of sets of pads on the printed circuit board.

Other features and advantages of the present invention will be apparent from the accompanying drawings and from the detailed description.

BRIEF DESCRIPTION OF THE DRAWINGS

The present invention is illustrated by way of example and not by way of limitation in the figures of the accompanying drawings in which like reference numerals refer to similar elements and in which.

DESCRIPTION OF THE INVENTION

An improved connector scheme for a power pod power delivery system is described. In the following detailed description, numerous specific details are set forth in order to provide a thorough understanding of the present invention. It will be apparent to one of ordinary skill in the art, however, that these specific details need not be used to practice the present invention. In other instances, well-known structures, interfaces and processes have not been shown in detail in order not to unnecessarily obscure the present invention.

Figure 1A:
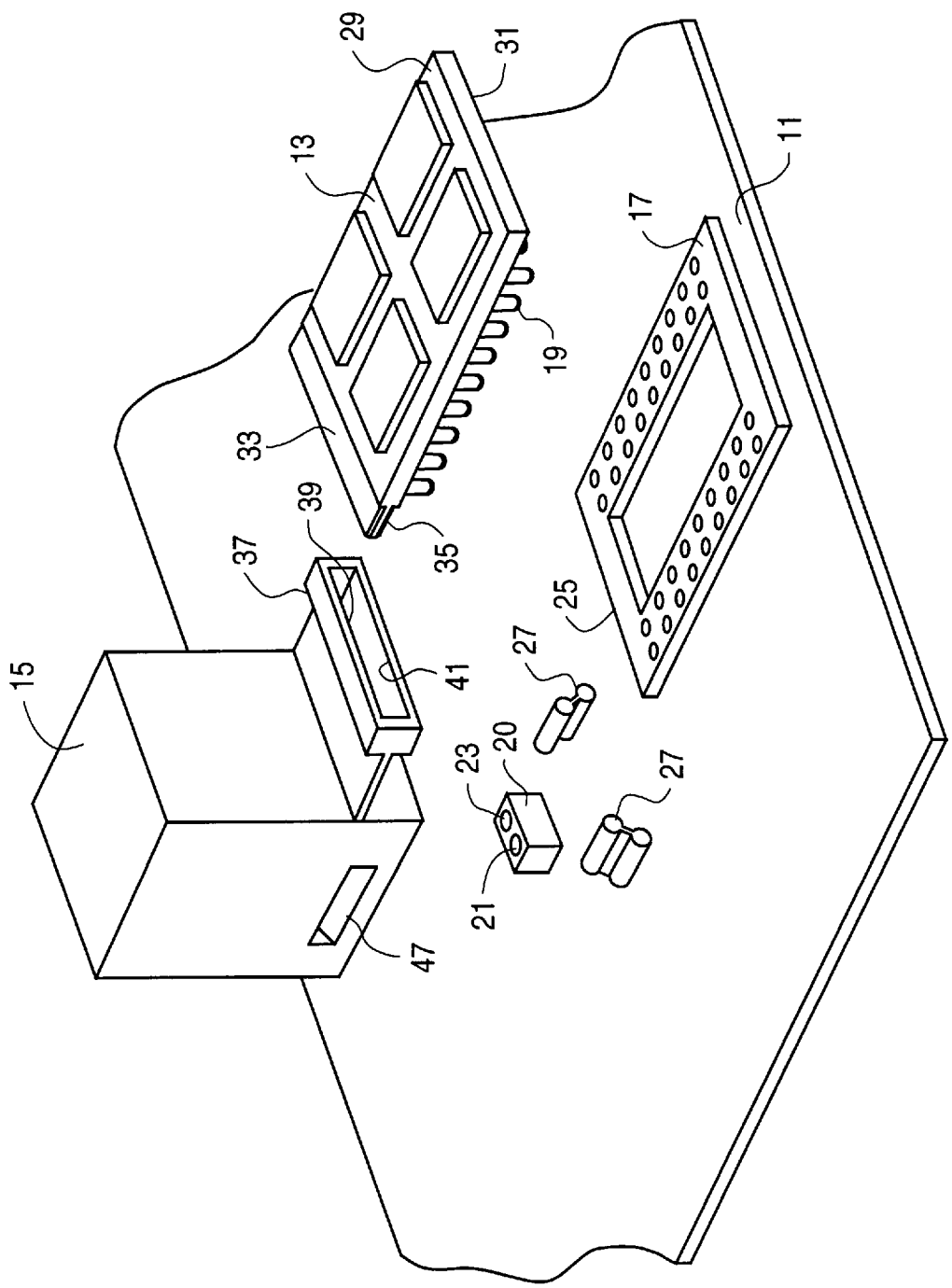
FIG. 1A is a perspective view showing the major components of the present invention separated from each other.

FIG. 1A is a perspective view illustrating the basic components of the improved power delivery (the power pod)

system. The three basic elements are a motherboard 11, a power consuming module 13, and a dc-to-dc power converter 15. In the illustrated embodiment, module 13 is a multi-chip module. The present invention is equally applicable, however, to a module with only one chip. Converter 15 includes conventional voltage conversion circuits within a housing having a rectangular cross section. The motherboard has mounted thereon first connector 17 in the form of a socket for receiving pins 19 on multi-chip module 13.

Connector 17 may be a signal connector. As compared to prior art connectors, the number of pins required on the power consuming module is reduced, thereby lowering the package insertion and removal forces required. In the illustrated embodiment, the connector is what is known as a Pin Grid Array (PGA) connector. A Land Grid Array (LGA) or Ball Grid Array (BGA) or other type connector could equally well be used. In conventional fashion, connector 17 includes rows of receptacles to receive pins along the lateral edges thereof. Although multi-chip module 13 can contain any type of electronic component which requires large amounts of power, in a typical embodiment, this module will contain one or more high speed processors and possibly associated circuits.

Also mounted on motherboard 11 is connector 20 with two terminals 21 and 23 into which mating pins may be plugged. Other types of connectors, including contacts directly on motherboard 11 may be used as terminals. These terminals connect to buses (not shown) on motherboard 11 and supply a voltage higher than that required by multi-chip module 13, e.g., +12 volts and ground. Connector 20 is spaced from rear edge 25 of connector 17.

In the illustrated embodiment, between connector 17 and connector 20 are fasteners 27 which can be in the form of spring clips. Other forms of fastening may also be used, if fasteners are required. Also in the illustrated embodiment is multi-chip module 13 with top and bottom surfaces 29 and 31. Each surface is a plane that terminates in planar power pads 33 and 35 respectively at the rear lateral edge of multi-chip module 13. This arrangement delivers the primary voltage to power consuming module 13.

The dc-to-dc converter includes an extending connector 37 which can be mounted to the housing in a flexible or rigid manner. This connector 37 has, for example, upper and lower contact surfaces which mate with the power pads 33 and 35 on the multi-chip module. These upper and lower surfaces can be a power plane pad and a ground plane. Also, power is advantageously provided to power consuming multi-chip module 13 through connector 37 that is separate and independent from signal connector 17. The increased dc currents to the power consuming module never flow on the motherboard. Instead of two power delivery interfaces, there is a single interface connector and the power converter is separable from the motherboard.

Figure 1B:
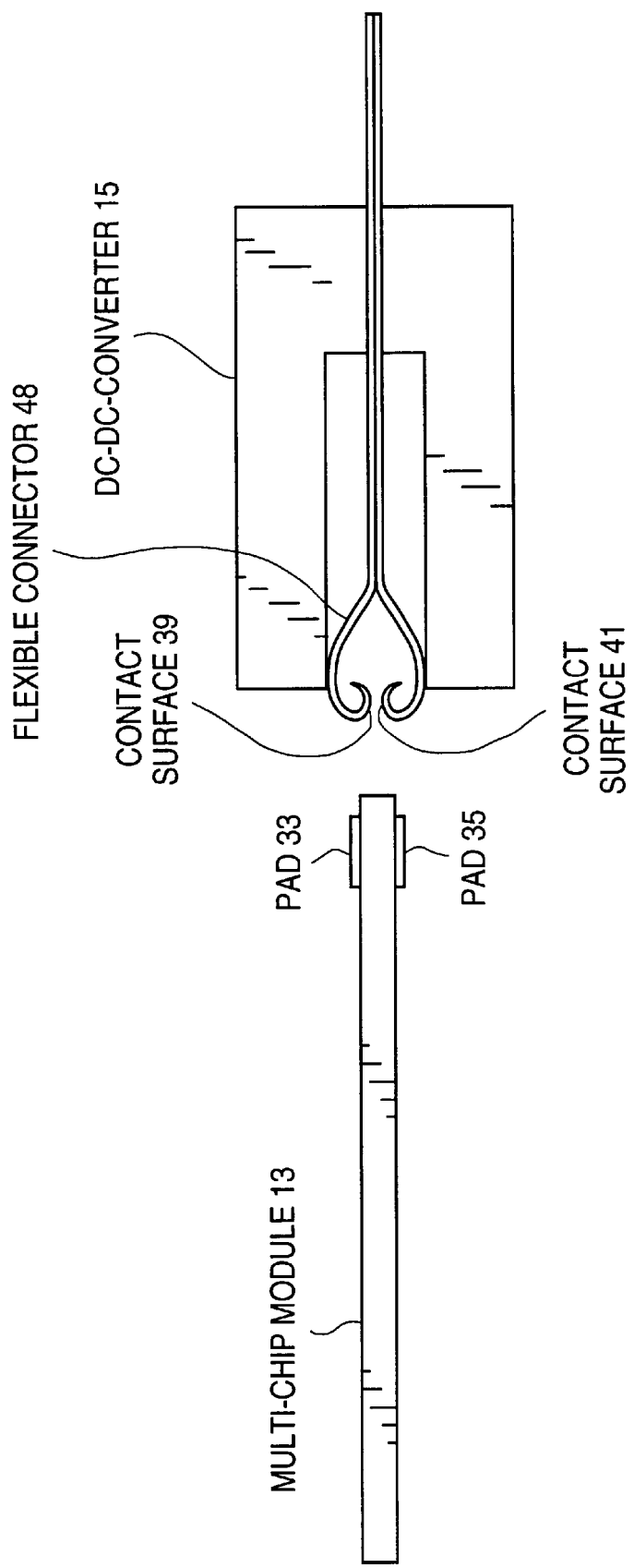
FIG. 1B is a side schematic view illustrating the power pads of a module to which power is being supplied extending into the connector from the dc-to-dc converter.

FIG. 1B illustrates a side view of the arrangement according to one embodiment. Specifically, FIG. 1B illustrates schematically (not to scale) the manner in which power pads 33 and 35 of the multi-chip module extend into the dc-to-dc converter contact surfaces 39 and 41. According to one embodiment, power pads 33 and 35 are planar pads. As illustrated, dc-dc converter 15 is adapted to receive multi-chip module 13. Contact surfaces 39 and 41 on dc-dc converter 15 provide contacts for planar power pads 33 and 35 on multi-chip module 13. Flexible connector 48 has a substantially concave curvature and springably couples multi-chip module 13 to dc-dc converter 15. This results in an interconnect that is a contained, low resistance, low inductance path between dc-to-dc converter 15 and multi-chip module 13.

Figure 1C:
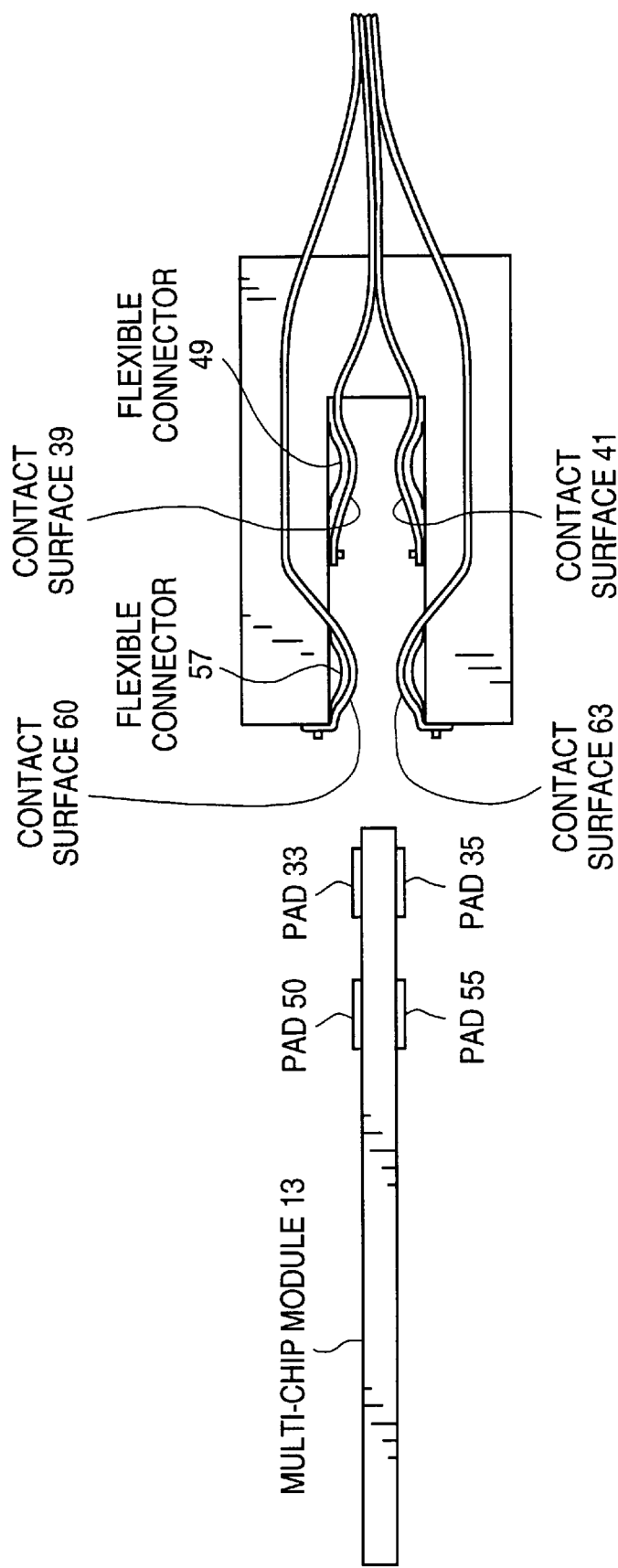
FIG. 1C is a side schematic view illustrating an embodiment of the present invention.

FIG. 1C illustrates an alternate embodiment of the present invention. As illustrated, the embodiment in FIG. 1C extends the arrangement of FIGS. 1A–B (not to scale) to include more than one set of pads. Thus, FIG. 1C illustrates the manner in which the power pads 33, 35, 50 and 55 of multi-chip module 13 extend into the dc-to-dc converter contact surfaces 39, 41, 60 and 63. Pads 33 and 35 continue to couple to dc-dc converter surfaces 39 and 41 respectively while pads 50 and 55 couple to dc-dc converter contact surface 60 and 63 respectively. According to one embodiment, pads 33, 35, 50 and 55 are each single planar pads. Flexible connectors 49 and 57 springably couple the multi-chip module 13 to dc-dc converter 15. Flexible connectors 49 and 57 each have a curved end and a substantially straight end, where the straight ends of the pads are substantially parallel and insulatedly coupled to each other.

According to this embodiment, flexible connectors 49 and 57 are designed to further reduce the low-resistance, low inductance path between dc-to-dc converter 15 and multi-chip module 13. Thus, instead of the substantially concave curvature of flexible connector 48 illustrated in FIG. 1B, flexible connectors 49 and 57 illustrated in FIG. 1C are substantially parallel, with minimal convex curvatures. The minimally convex curvatures allow for a springable coupling between multi-chip module 13 and dc-to-dc converter 15 while lowering further the resistance and inductance on the path between the two units.

The first set of pads 33 and 35 continues to deliver the primary voltage to power consuming module 15. According to one embodiment, the second set of pads 50 and 55 may deliver signals and other voltages. In another embodiment, the second set of pads 50 and 55 may also be used to deliver the primary voltage, thus reducing impedance even further. In either embodiment, the use of the second set of pads extends the concept in FIG. 1B to allow for a more flexible power and signal delivery system. Specifically, the embodiments of FIG. 1C allow for parallel routing of signals and voltages together with the main power supply/primary voltage.

This concept may be further extended to include multiple sets of pads as long as the main goal of maintaining a low inductance, low resistance current path is retained. The multiple sets of pads may be utilized to route a combination of voltages and signals. The key requirement in any embodiment of the present invention is a structure which provides a low inductance, low resistance current path.

Figure 2B:
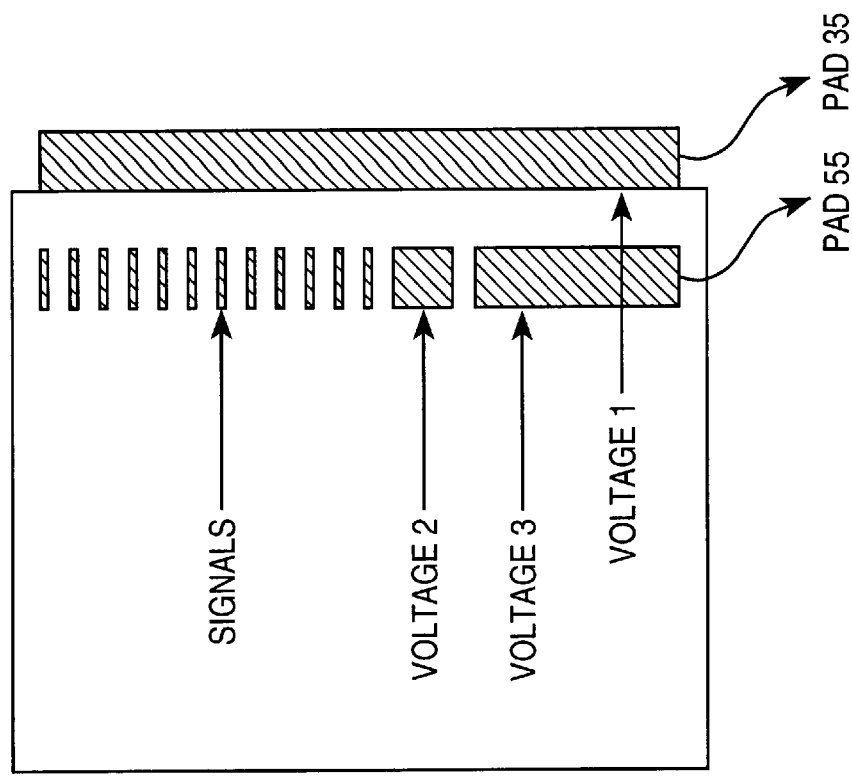
FIG. 2B is a bottom schematic view illustrating the power pads of a module to which power is being supplied extending into the connector from the dc-to-dc converter.
Figure 2A:
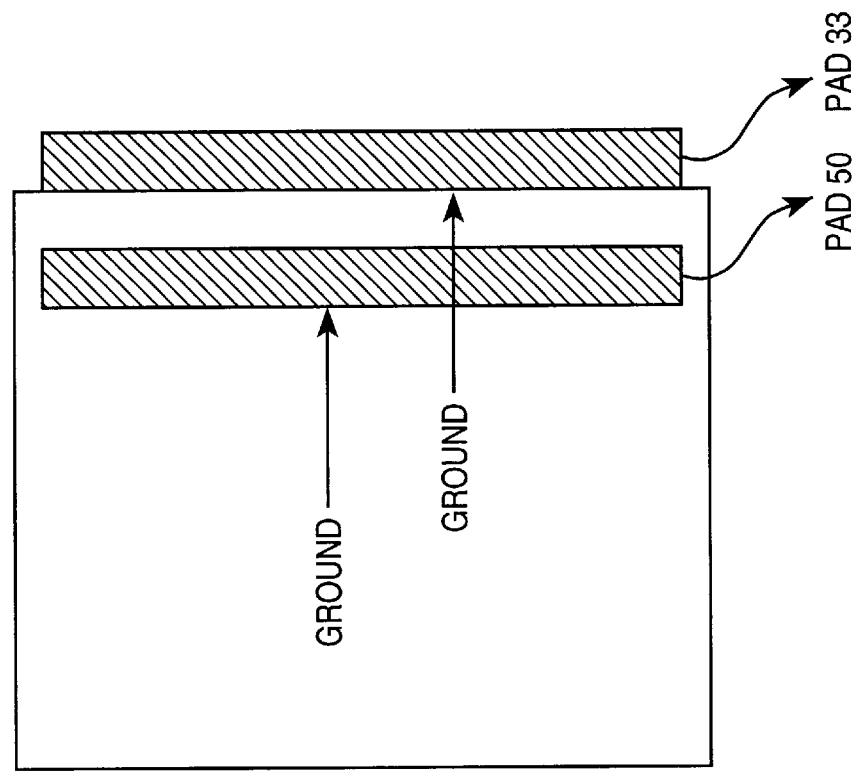
FIG. 2A is a top schematic view illustrating the power pads of a module to which power is being supplied extending into the connector from the dc-to-dc converter.

FIGS. 2A–B illustrate yet another embodiment of the present invention. FIG. 2A is a top view of multi-chip module 13, including pads 50 and 33. In the illustrated embodiment, both pads 50 and 33 are grounded.

FIG. 2B is a bottom view of multi-chip module 13, including pads 55 and 35.

Although pad 35 is illustrated as a single planar pad (as in the embodiment of FIGS. 1B–C), according to this embodiment, pad 55 is divided into multiple smaller pads. Thus, pad 55 is now able to provide multiple voltages and signals. Although as illustrated, pad 55 provides only 2 voltages and a series of signals, pad 55 may be configured to supply any number of voltages and signals.

Figure 3:
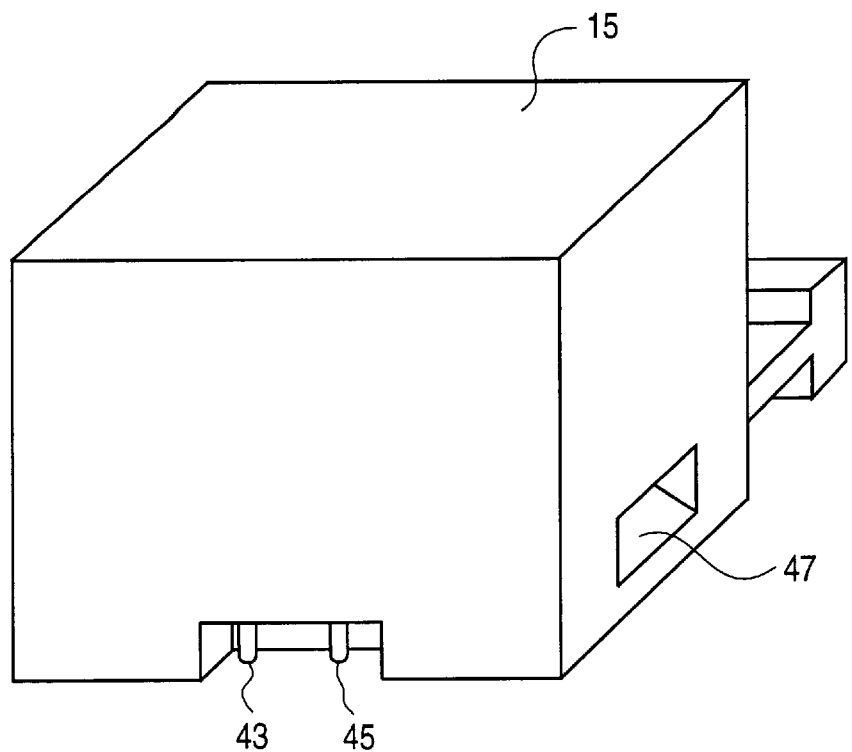
FIG. 3 is a rear perspective view of the dc-to-dc converter of FIG. 1 showing its higher voltage contacts.

FIG. 3 illustrates a view of the dc-to-dc converter 15 rotated such that the rear surface of its housing is visible. As illustrated, it includes, at the back of the dc-to-dc converter, extending from the bottom of the housing thereof, pins 43 and 45 which mate with the terminals 21 and 23 in the connector 20 when the dc-to-dc converter 15 is inserted onto the motherboard 11. The force of the terminals 21 and 23 may be sufficient to hold the dc-dc converter 15 in place.

In the illustrated embodiment, however, an additional fastener is also provided. Thus, also visible in this view is one of the indentations or recesses 47 found on the sides of the dc-to-dc converter housing into which the spring clips 27 snap when the dc-to-dc converter is mounted on the motherboard 11. The spring force of the spring clips 27 holds the dc-to-dc power converter securely on the motherboard 11. If fastening beyond that provided by the connector 20 and pins 43 and 45 is needed, alternative fasteners such as screws, can equally well be used. In a manner known to those skilled in the art, circuits in the dc-to-dc power converter 15 then convert this higher voltage to a lower voltage which is supplied at its contacts 39 and 41 and thence to the power pads 33 and 35 of the multi-chip module.

Figure 4:
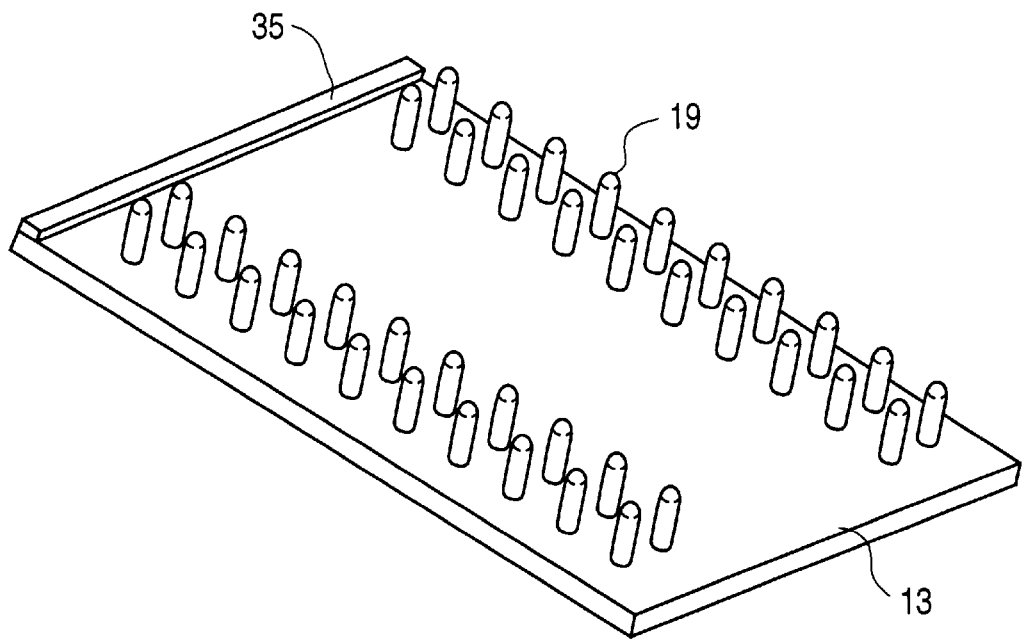
FIG. 4 is a bottom perspective view of the multi-chip module of FIG. 1 showing its pins and bottom power connection.
Figure 5:
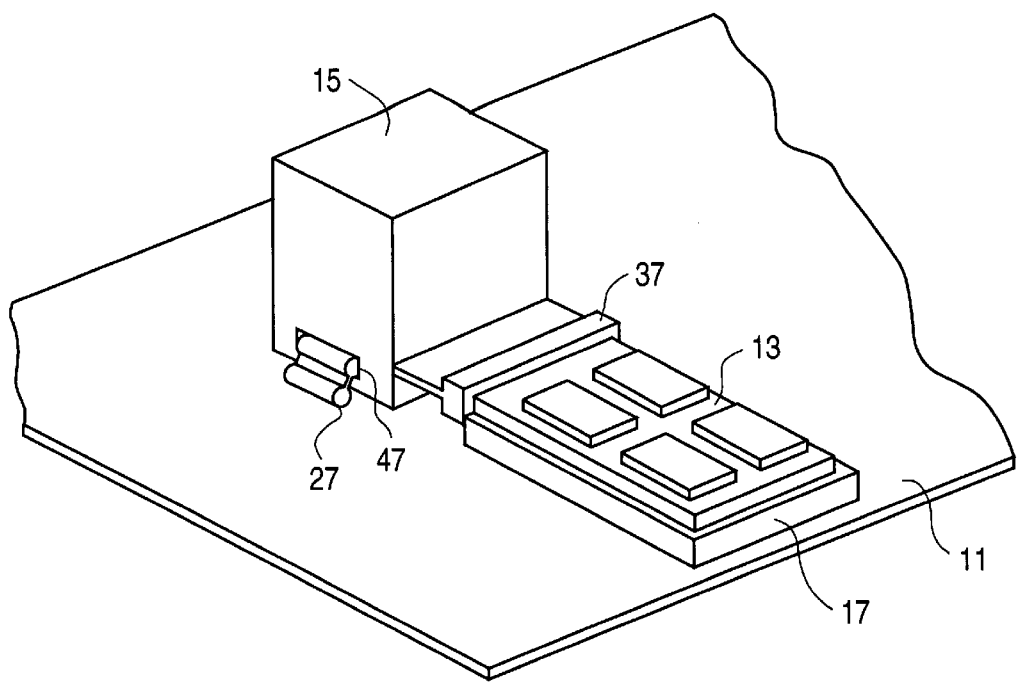
FIG. 5 is a perspective view showing the components of the present invention in an assembled condition.

FIG. 4 is a view of the module 13 turned upside down so that the bottom power pad 35 is visible along with the pins 19. FIG. 5 is a perspective view showing the components assembled. The module 13, after having its edge inserted into the connector 37 has the pins 19 on the bottom thereof inserted into the connector 17. As illustrated, this manner of installing the dc-dc converter provides manufacturing advantages in that the dc-to-dc converter can be separately tested and simply inserted onto the motherboard; the need to construct and test the dc-to-dc converter on the motherboard is eliminated. The dc-to-dc converter 15 is held in contact with the motherboard 11 by the spring clips 27 engaging in the recesses 47. Although spring clips are illustrated, other forms of fastening are possible such as screws passing through tabs having corresponding holes on the dc-dc converter, into threaded bores in the circuit board.

Figure 6:
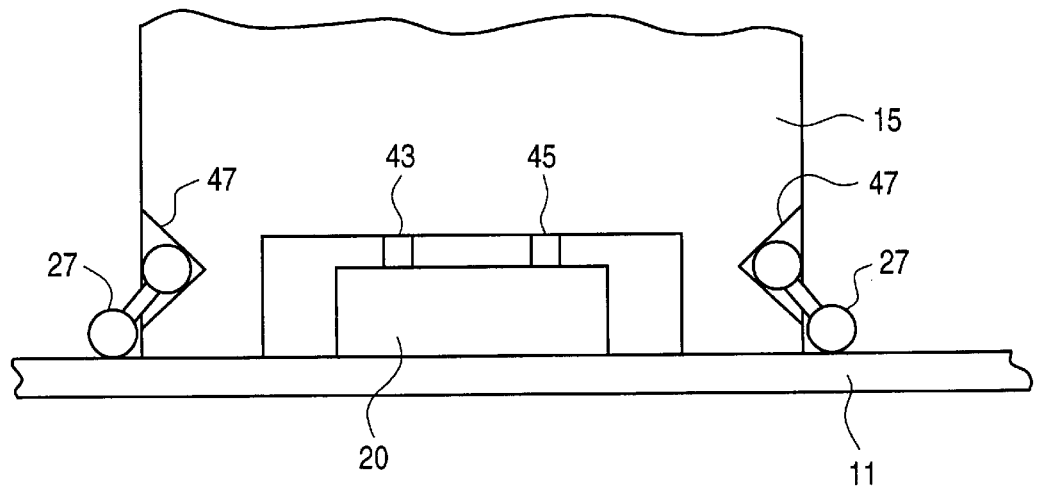
FIG. 6 is a cross section through the rear portion of the dc-to-dc converter and motherboard showing the spring clip attachment and the contacting of the contacts of the dc-to-dc converter with the contacts on the motherboard.

As illustrated by the rear view of FIG. 6, the fastening assembly described above maintains the dc-to-dc converter 15 in good contact with the motherboard 11, and prevents the connection between pins 43 and 45 and the terminals in connector 20 from being broken.

Thus, an improved connector scheme for a power pod power delivery system is disclosed. The specific arrangements and methods described herein, are merely illustrative of the principles of the present invention. Numerous modifications in form and detail may be made by those of ordinary skill in the art without departing from the scope of the invention. Although this invention has been shown in relation to a particular preferred embodiment, it should not be considered so limited. Rather, the present invention is limited only by the scope of the appended claims.

What is claimed is:

1. Apparatus for delivering power from a motherboard to an integrated circuit (IC) module, the motherboard being supplied with a first D.C. voltage from a power supply, the apparatus comprising:

a power converter mounted on the motherboard which converts the first D.C. voltage into a second D.C. voltage, the second D.C. voltage being lower than the first D.C. voltage, the power converter comprising:
  a first terminal connected to receive the first D.C. voltage from the motherboard; and
  a female connector for detachably connecting the IC module to the motherboard, the female connector including a plurality of flexible connectors providing upper and lower contact surfaces, each of the upper and lower contact surfaces being arranged so as to mate with corresponding contact pads disposed along upper and lower planar surfaces of a side of the module upon insertion of the side into the female connector,
wherein a first set of the flexible connectors provides signal connection to the IC module, and a second set of the flexible connectors provides the second D.C. voltage to the IC module.

2. The apparatus of claim 1 further comprising a fastening mechanism for fixedly attaching the power converter to the motherboard.

3. The apparatus of claim 1 wherein the upper and lower contact surfaces are arranged in rows, at least a portion of one row providing the second D.C. voltage.

* * * * *

UNITED STATES PATENT AND TRADEMARK OFFICE
CERTIFICATE OF CORRECTION

PATENT NO.   : 5,980,267
DATED        : November 9, 1999
INVENTOR(S)  : Karnik et al.

It is certified that error appears in the above-identified patent and that said Letters Patent is hereby corrected as shown below:

Column 3,
Line 47, after "upper and lower", insert -- contact --.

Signed and Sealed this

Tenth Day of June, 2003

JAMES E. ROGAN
*Director of the United States Patent and Trademark Office*